United States Patent
Allman et al.

(10) Patent No.: US 6,522,006 B1
(45) Date of Patent: *Feb. 18, 2003

(54) LOW DIELECTRIC CONSTANT MATERIAL IN INTEGRATED CIRCUIT

(75) Inventors: Derryl D. J. Allman, Colorado Springs, CO (US); Kenneth P. Fuchs, Colorado Springs, CO (US); Gayle W. Miller, Colorado Springs, CO (US); Samuel C. Gioia, Colorado Springs, CO (US)

(73) Assignee: Hyundai Electronics America Inc., San Jose, CA (US)

( * ) Notice: Subject to any disclaimer, the term of this patent is extended or adjusted under 35 U.S.C. 154(b) by 80 days.

This patent is subject to a terminal disclaimer.

(21) Appl. No.: 09/695,020

(22) Filed: Oct. 23, 2000

Related U.S. Application Data

(62) Division of application No. 08/829,745, filed on Mar. 31, 1997, now Pat. No. 6,208,029, which is a continuation of application No. 08/374,016, filed on Jan. 18, 1995, now abandoned, which is a continuation of application No. 08/165,872, filed on Dec. 14, 1993, now Pat. No. 5,438,022.

(51) Int. Cl.[7] ............................................. H01L 23/48

(52) U.S. Cl. ........................................ 257/758; 257/635

(58) Field of Search ............................. 257/758, 759, 257/700, 635, 637, 641, 642, 643, 644, 659, 655, 784, 786

(56) References Cited

U.S. PATENT DOCUMENTS

| 3,676,756 A | 7/1972 | Merrin | 317/235 |
| 4,039,702 A | 8/1977 | DiBugnara et al. | 427/93 |
| 4,339,526 A | 7/1982 | Baise et al. | 430/296 |
| 4,437,139 A | 3/1984 | Howard | 361/313 |

(List continued on next page.)

FOREIGN PATENT DOCUMENTS

| DE | 3116406 | 1/1982 | |
| DE | 3805490 | 9/1998 | |
| EP | 0122631 | 10/1984 | H01L/23/52 |
| EP | 0501564 | 9/1992 | H01L/23/31 |
| JP | 0241832 | 9/1989 | H01L/21/60 |
| JP | 0030171 | 1/1990 | H01L/23/29 |
| JP | 2237030 | 9/1990 | H01L/21/316 |

OTHER PUBLICATIONS

Silicon Processing for the VLSI Era, vol. 2: Process Integration, Stanley Wolf Ph.D., 1990, pp. 229–237.

European Patent Office publication of Patent Abstacts of Japan for Japanese Application No. 01261332, published as publication No. 03124052 on May 27, 1991.

European Patent Office publication of Patent Abstacts of Japan for Japanese Application No. 01290216, published as publication No. 03151657 on Jun. 27, 1991.

Jaouen, H., et al., "Impact of Low K Dielectric on Dynamic Electrical Performances of 0.35 $\mu$m IC," SGS–Thomson, Crolles–France, date unknown.

Matsumoto, K., et al. "Gas Permeation of Aromatic Polyimides. I. Relationship Between Gas Permeabilities and Dielectric Constants," Journal of Membrane Science 81 (1993) pp 15–22 © 1993 Elsevier Science Pulishers B.V.

Matsumoto, K., et al. "Gas Permeation of Aromatic Polyimides. II. Influence of Chemical Structure," Journal of Membrane Science 81 (1993) p. 23 © 1993 Elsevier Science Publishers B.V.

(List continued on next page.)

Primary Examiner—Roy Potter
(74) Attorney, Agent, or Firm—Townsend and Townsend and Crew LLP

(57) ABSTRACT

A low dielectric material is applied, as by spinning on, over the passivation layer of a semiconductor chip to fill the gaps which may exist between the top layer metal lines, and thereby minimize the possibility of cross talk which might otherwise be present between those lines.

7 Claims, 3 Drawing Sheets

U.S. PATENT DOCUMENTS

| | | | |
|---|---|---|---|
| 4,654,223 A | 3/1987 | Araps et al. | 427/12 |
| 4,656,050 A | 4/1987 | Araps et al. | 427/12 |
| 4,719,125 A | 1/1988 | Anello et al. | 437/231 |
| 4,733,289 A | 3/1988 | Tsurumaru | 357/54 |
| 4,810,673 A | 3/1989 | Freeman | 437/239 |
| 4,859,253 A | 8/1989 | Buchanan et al. | 148/33.3 |
| 4,965,134 A | 10/1990 | Ahne et al. | 428/411.1 |
| 4,965,226 A | 10/1990 | Gootzen et al. | 437/189 |
| 5,001,108 A | 3/1991 | Taguchi | 505/1 |
| 5,003,062 A | 3/1991 | Yen | 437/231 |
| 5,043,789 A | 8/1991 | Linde et al. | 357/52 |
| 5,051,377 A | 9/1991 | Euen et al. | 437/24 |
| 5,114,754 A | 5/1992 | Cronin et al. | 427/333 |
| 5,117,272 A | 5/1992 | Nomura et al. | 357/52 |
| 5,122,483 A | 6/1992 | Sakai et al. | 437/238 |
| 5,206,091 A | 4/1993 | Beuhler et al. | 428/446 |
| 5,254,497 A | 10/1993 | Liu | 437/173 |
| 5,260,600 A | 11/1993 | Harada | 257/639 |
| 5,290,399 A | 3/1994 | Reinhardt | 156/655 |
| 5,430,329 A | 7/1995 | Harada et al. | 257/786 |
| 5,438,022 A | 8/1995 | Allman et al. | |
| 6,208,029 B1 * | 3/2001 | Allman et al. | 257/758 |

OTHER PUBLICATIONS

Auman, Brian C., "Polymides and Copolymides with Low Dielectric Constant, Low Moisture Absorption, and Low Coefficient of Thermal Expansion for Use and Interlayer Dielectrics," Materials Research Society Symposium Proceedings, vol. 337, © 1994 Materials Research Society, pp 705–715.

* cited by examiner

TYPICAL

LOW DIELECTRIC CONSTANT MATERIAL IN INTEGRATED CIRCUIT

This application is a divisional application of, and claims priority from application Ser. No. 08/829,745 filed Mar. 31, 1997 U.S. Pat. No. 6,208,029 which is a continuation of Ser. No. 08/374,016 filed Jan. 18, 1995 abandoned which is a continuation of Ser. No. 08/165,872 filed Dec. 14, 1993 now U.S. Pat. No. 5,438,022.

BACKGROUND OF THE INVENTION

The present invention relates to a method for producing an integrated circuit device and more particularly relates to a method for producing an integrated circuit device in which circuit cross talk is minimized by using a low dielectric constant coating material.

Cross talk between top layer metal interconnect lines of a semiconductor device can be caused by a high dielectric constant material filling the space between two metal lines. The plastic material commonly used for packaging of integrated circuits normally has a dielectric constant of between 6 and 8. As moisture penetrates the plastic material, the dielectric constant of the material increases. A higher dielectric constant increases the likelihood of capacitive coupling between adjacent metal lines.

Cross talk and capacitive effects between metal lines in a semiconductor chip are becoming greater problems with shrinking geometries and increasing chip speeds. Many of the attendant problems are difficult to model and will inexplicably show up as errors.

SUMMARY OF THE INVENTION

In accordance with the present invention, a method for minimizing circuit cross talk between adjacent metal lines in an integrated circuit device is provided. This method employs the application of a low dielectric constant material over the passivation layer of an integrated circuit semiconductor device.

It is accordingly an object of the present invention to provide a method for minimizing cross talk between adjacent metal lines in an integrated circuit device.

It is another object of the present invention to provide a method for minimizing cross talk in an integrated circuit having a passivation layer by applying a low dielectric constant material over the passivation layer.

Another object is to provide a method for minimizing cross talk in an integrated circuit which includes the steps of applying a low dielectric constant material to the integrated circuit and curing the resulting structure by heating in a suitable atmosphere.

Additional benefits and advantages of the present invention will become apparent to those skilled in the art to which this invention relates from the subsequent description of the preferred embodiment and the appended claims, taken in conjunction with the accompanying drawings.

DETAILED DESCRIPTION

Figure 1:
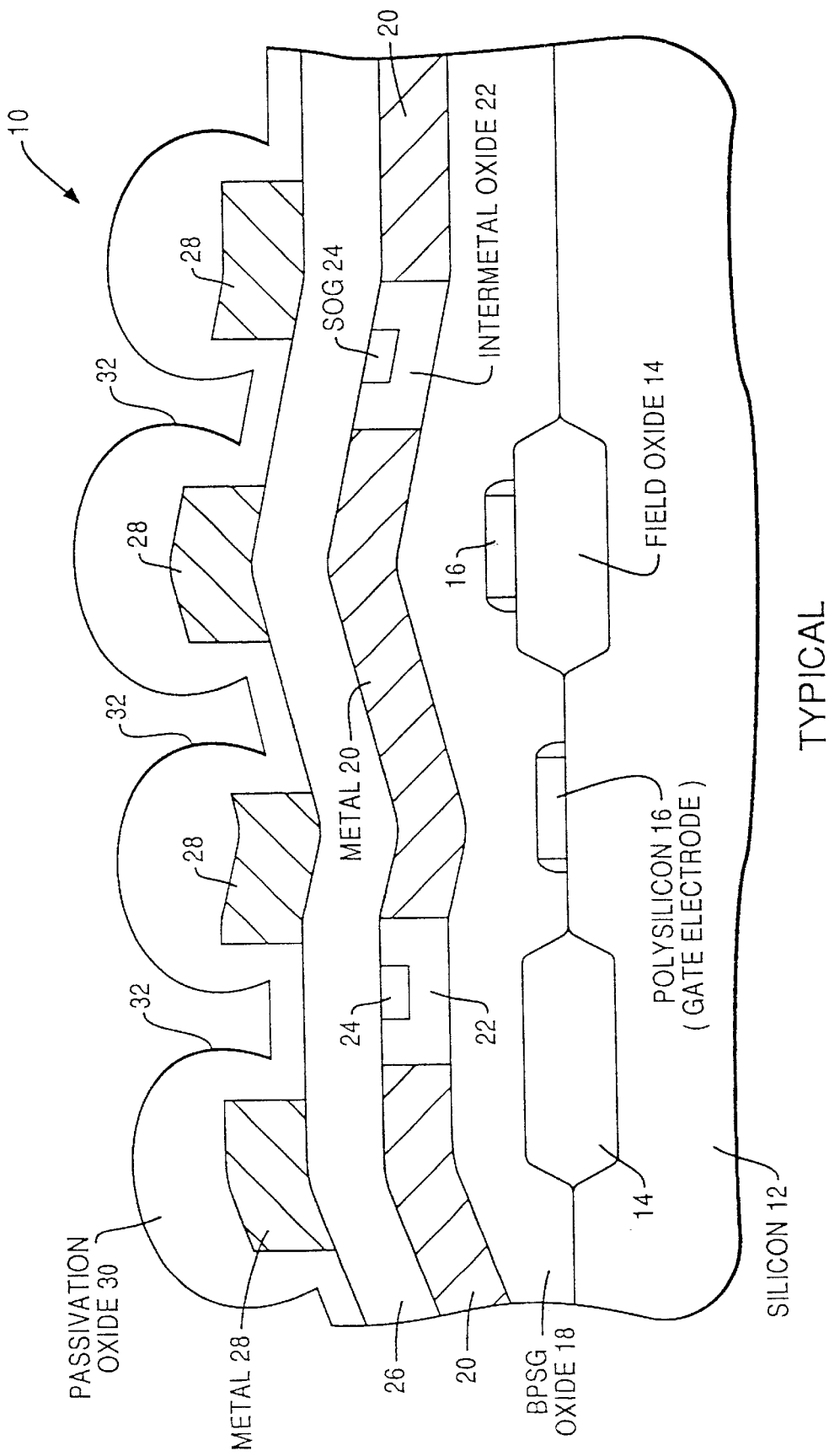
FIG. 1 is a sectional view of a typical integrated circuit wafer before a passivation SOG layer applied thereto.

Referring now to FIG. 1, shown there is a cross-sectional view of a typical integrated circuit device 10, including a silicon substrate 12, field oxide elements 14 for isolation between transistors and polysilicon gates 16. A BPSG (boron phosphorus doped glass) oxide 18 extends over the substrate 12 and elements 14 and 16, while a first group of metal lines 20 are located over the BPSG oxide 18, and are separated by a first dielectric layer of intermetal oxide 22, having an SOG dielectric layer 24 positioned in the oxide layer 22. A second layer of intermetal oxide 26 is applied over the metal lines 20, the first oxide layer 22 and the SOG layer 24. Above the second layer of oxide 26 is a second group of metal lines 28 which may be disposed at right angles to the first lines 20. A passivation oxide 30 is deposited over the second group of metal lines 28. It will be seen that the passivation oxide 30 is not completely planar, but is formed, as a result of the deposition, with grooves or depressions 32 which extend downwardly between the metal lines 28.

Figure 2:
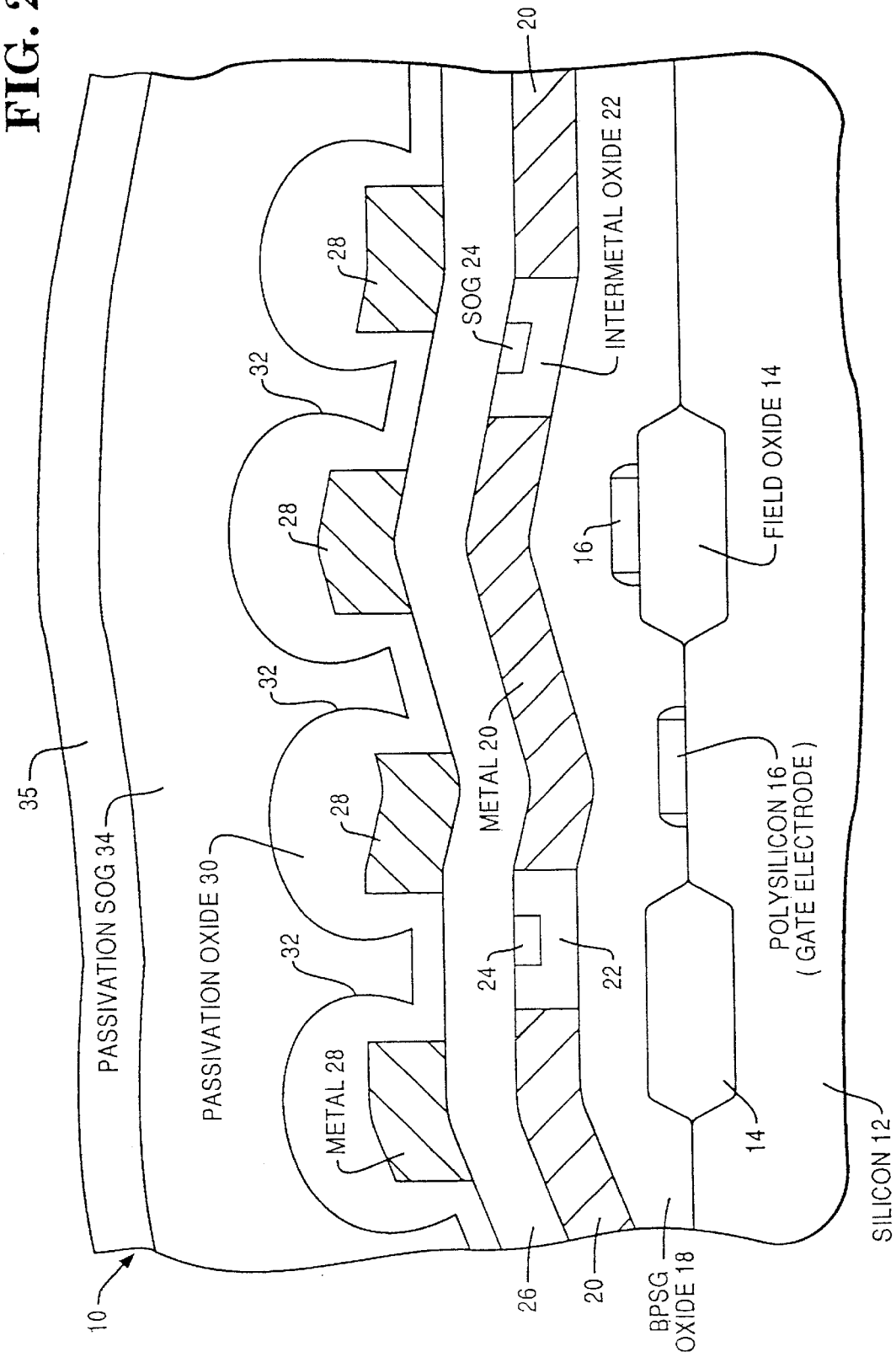
FIG. 2 is a sectional view similar to FIG. 1, but showing a passivation SOG layer applied thereto.

FIG. 2 shows the integrated circuit device 10 of FIG. 1 with a low dielectric constant passivation layer 34 added, in accordance with the present invention. It will be noted that the layer 34 fills the grooves 32 in the passivation oxide 30 between the metal lines 28, in addition to extending over the entire upper surface of the integrated circuit device 10. The plastic material which is normally used for packaging devices such as the integrated circuit device 10 is thus prevented from penetrating into the grooves 32 in the passivation oxide 30, where it might cause cross talk between adjacent metal lines 28.

Figure 3:
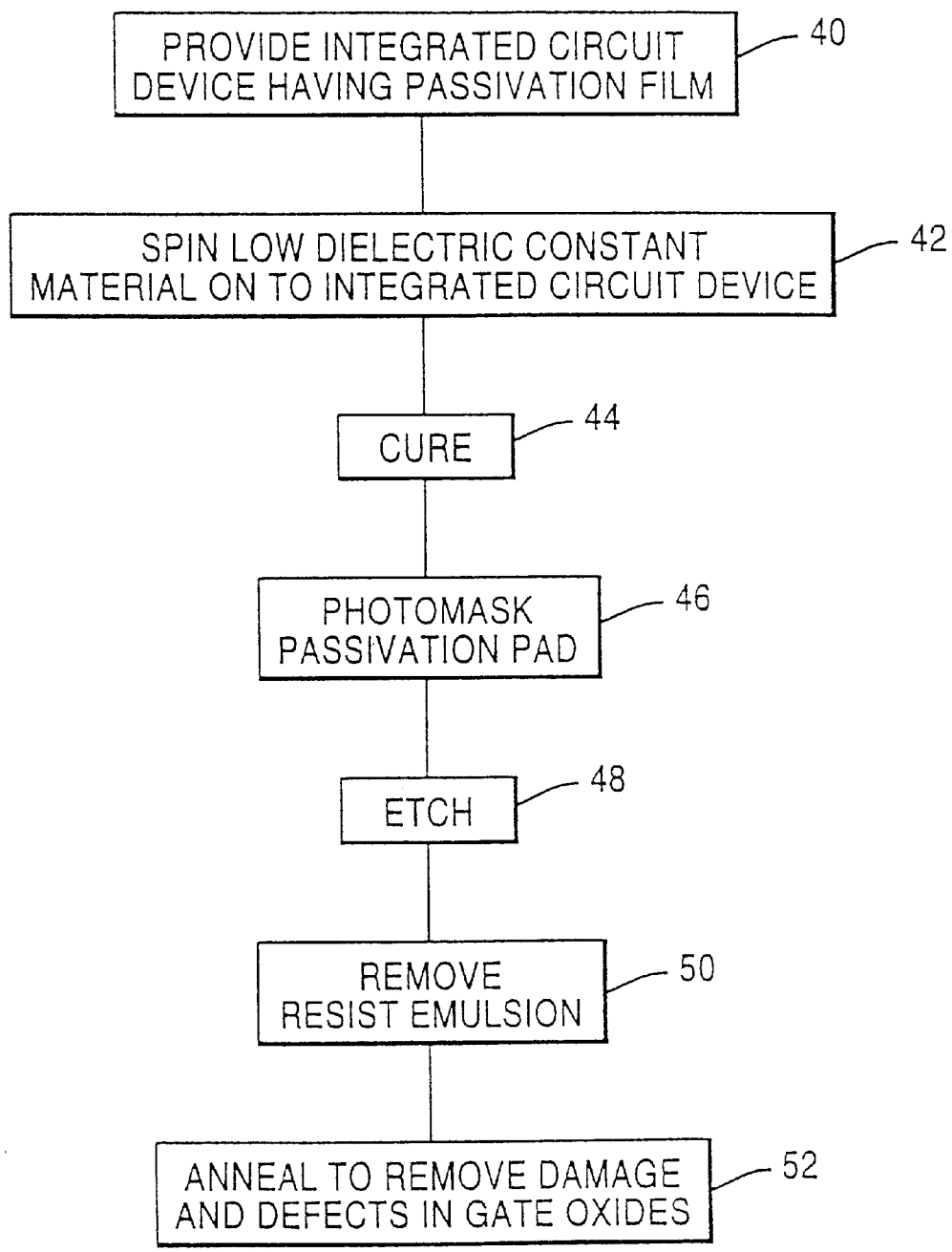
FIG. 3 is a flow diagram showing a process in which a passivation SOG layer is applied to an integrated circuit wafer.

The process for applying the passivation SOG layer 34 to the integrated circuit device 10 will now be described with reference to the flow diagram of FIG. 3. As shown in FIG. 3, and as represented by block 40, the process is initiated by the providing of an integrated circuit device, such as the device 10 of FIG. 1, on which a passivation film or oxide may have been applied.

Following this, and as represented in block 42, a low dielectric constant material 34 is spun or otherwise applied on top of the upper surface of the integrated circuit device 10, which surface may comprise the passivation oxide 30. As is well known, in the spin on glass (SOG) process, SOG is dispersed on a stationary wafer, and the wafer is then spun so that the SOG is distributed on the wafer by centrifugal force. The final thickness of the layer is based, at least in part, upon the spin rate.

The following materials are among those which have a low dielectric constant and can be spun on top of the passivation oxide 30: polyimide, spin-on-glass (SOG), glass resins of various compositions, polytetrafluoroethylene which is also known by the chemical name polytetrafluoroethylene. The range in dielectric constant for these materials is from 2 to 5. The dielectric constants of the SOGs, glass resins and polytetrafluoroethylene materials do not appreciably increase with moisture incorporation. The thickness of the spun-on coating may vary from approximately one tenth micron to approximately twenty microns, depending on various considerations, such as the material being used.

Following the spinning on of material, the method includes a curing step, as represented by block 44. This curing can be accomplished in a furnace, or by other means, such as a bake oven or a hot plate oven. The temperature employed will normally vary from approximately 100 degrees Celsius to approximately 500 degrees Celsius, and the duration of the curing may vary widely, from a duration of approximately ten seconds to a duration of approximately seven hours. The curing process can take place in one of a number of different atmospheres, including air, oxygen, argon, nitrogen or forming gas, which comprises 10% hydrogen and 90% nitrogen. A typical curing operation may employ a temperature of 400 degrees Celsius for a duration of one hour in an atmosphere of nitrogen.

When the curing has been completed, photomasking and etching steps may be performed (blocks 46 and 48). This is done to open areas in the SOG layer and the passivation oxide layer to facilitate bonding from the package to the integrated circuit device.

Next, the resist emulsion from the steps represented by blocks 46 and 48 is removed, as represented by block 50. This step may not be necessary if the photoresist is completely consumed in the etching step.

Finally, as represented in block 52, the integrated circuit device 10 is annealed to remove any damage and defects which may be present in the gate oxides. It should be noted that this alloying or annealing step can be done prior to the application of the passivation oxide 30, or in some instances not at all.

The low dielectric constant coating material can also be used as a layer to relieve the stress which is imparted to the die or wafer by the application of the plastic thereto, if the layer exceeds one micron in thickness. If polytetrafluoroethylene based material is used, it may have to receive a special treatment after the final cure operation to enable the plastic encapsulating material to stick to the wafer. The polytetrafluoroethylene surface may have to be roughened.

A relatively thick layer of the low dielectric constant material would also serve as a barrier to alpha particles which can cause errors in the integrated circuit device. For this, a layer in excess of five microns would be needed.

Although the invention has been described with particular reference to a preferred embodiment thereof, variations and modifications of the present invention can be effected within the spirit and scope of the following claims.

What is claimed is:

1. An integrated circuit device comprising:
    a plurality of top layer metal interconnect lines;
    a passivation layer disposed over said top layer metal interconnect lines and having gaps which extend between said metal interconnect lines;
    low dielectric constant material disposed over said passivation layer and in said gaps to prevent the deposition of a high dielectric constant material in said gaps and to reduce crosstalk between said metal interconnect lines at high operating speeds of said integrated circuit;
    high dielectric constant material disposed over said low dielectric constant material;
    wherein said low dielectric constant material has a thickness greater than 10 microns and less than about 20 microns so as to serve as a barrier to alpha particles during operation; and
    wherein said low dielectric material comprises polytetrafluoroethylene.

2. The integrated circuit device of claim 1 wherein said low dielectric constant material consists of polytetrafluoroethylene.

3. The integrated circuit device of claim 1 wherein said low dielectric constant material has a dielectric constant of between about 2 and about 5.

4. The integrated circuit device of claim 3 wherein said high dielectric constant material has a dielectric constant of between about 6 and about 8.

5. The integrated circuit device of claim 1 wherein said high dielectric constant material has a dielectric constant of between about 6 and about 8.

6. The integrated circuit device of claim 1 wherein said passivation layer has a dielectric constant that is higher than said low dielectric constant material.

7. The integrated circuit device of claim 1 and further comprising:
    a wafer; and
    means for relieving stress imparted to said wafer by said high dielectric constant material.

* * * * *